United States Patent [19]

Kelly et al.

[11] 4,196,389
[45] Apr. 1, 1980

[54] TEST SITE FOR A CHARGED COUPLED DEVICE (CCD) ARRAY

[75] Inventors: Helen J. Kelly; David J. Perlman; Akella V. S. Satya, all of Wappingers Falls, N.Y.

[73] Assignee: International Business Machines Corporation, Armonk, N.Y.

[21] Appl. No.: 924,128

[22] Filed: Jul. 13, 1978

[51] Int. Cl.² .................. G01R 31/02; G01R 31/22
[52] U.S. Cl. ............................ 324/158 R; 324/73 R; 365/201
[58] Field of Search ........... 324/158 T, 158 D, 158 R, 324/73 R; 357/24; 307/221 D; 365/201

[56] References Cited

U.S. PATENT DOCUMENTS

| | | | |
|---|---|---|---|
| 3,763,480 | 10/1973 | Weimer | 357/22 |
| 3,790,885 | 2/1974 | James | 324/73 R |
| 3,815,025 | 6/1974 | Jordan | 324/73 R |
| 4,117,546 | 9/1978 | Anantha et al. | 357/24 |
| 4,139,910 | 2/1979 | Anantha et al. | 365/212 |

OTHER PUBLICATIONS

Kosonocky et al.; "Basic Concepts of Charge-Coupled Devices;" RCA Review; Sep. 1975; pp. 586–592.

Primary Examiner—Rudolph V. Rolinec
Assistant Examiner—Ernest F. Karlsen
Attorney, Agent, or Firm—Theodore E. Galanthay

[57] ABSTRACT

Disclosed is a test site for an integrated circuit chip including a CCD register. Two serial CCD registers are spaced from each other at incrementally variable intervals. The first register receives a serial bit stream having a first binary value while the second serial register receives a bit stream having a second binary value. Data is transferred in parallel from the second register to determine the point at which the spacing between the two registers is sufficiently close to permit undesirable cross-talk.

4 Claims, 5 Drawing Figures

TEST SITE FOR A CHARGED COUPLED DEVICE (CCD) ARRAY

DESCRIPTION

TECHNICAL FIELD

This invention relates to a test site for an integrated circuit chip including a CCD register and more particularly to a gauge for measuring isolation between its adjacent channels.

A primary object of the present invention is to provide a test site for determining the minimum allowable isolation distance between adjacent CCD channels in a planar integrated circuit design.

It is another object of this invention to measure charge transfer efficiency and charge leakage characteristics under various test conditions with a single device and test structure.

BACKGROUND ART

Charge coupled devices are a popular form of semiconductor integrated storage cell for digital data processor storage. An example of such a digital storage is found in Anantha et al patent application Ser. No. 865,806, filed Dec. 30, 1977, now U.S. Pat. No. 4,117,546 issued on Sept. 26, 1978, and entitled: "Interlaced CCD Memory". This application teaches one type of CCD data storage for which the test site of the present invention could be advantageously utilized and it is therefore incorporated herein by reference.

In the referenced application as well as in other references such as Weimer, U.S. Pat. No. 3,763,480, a serial-parallel-serial (SPS) structure is described. In an SPS configuration, a data bit stream is injected into a serial CCD shift register from where it is transferred in parallel to a parallel storage register. The data can then be shifted in parallel through the parallel register, transferred in parallel to an output serial register, from where it is shifted out as a serial bit stream.

In an SPS configuration, the bulk of the data is usually stored in the parallel section, the serial registers being utilized as input and output registers. Structurally, the parrallel section resembles a large number of serial registers placed in parallel and clocked by common clock lines to transfer the information in parallel through the parallel section. The proximity of the individual serial registers forming the parallel section is a critical constraint. Density considerations favor the registers to be placed as close as possible so that a maximum amount of data can be stored in a minimum amount of semiconductor space. When two registers are placed too close to each other, however, cross-talk results causing the information containing charge to leak between registers and eventually to be lost. On the other hand, excessively large spacing is wasteful of semiconductor space.

It should further be noted that in addition to register spacing, the aforementioned cross-talk varies with phase clock amplitude and frequency, input signal amplitude, temperature and applied voltage levels. Cross-talk can also be affected by the various processing parameters in the fabrication of CCD registers. For example, substrate doping levels affect the permissible spacing between registers forming a parallel section for an SPS CCD memory. A need has therefore developed for a test site which will quickly and efficiently determine the operational characteristics of a CCD register under various parameters and will occupy a minimum amount of space on the semiconductor.

BRIEF DESCRIPTION OF THE DRAWINGS

In the accompanying drawings forming a material part of this disclosure.

DISCLOSURE OF INVENTION

For further comprehension of the invention and the objects and advantages thereof, reference will be had to the following description and accompanying drawings and to the appended claims in which the various novel features of the invention are more particularly set forth.

Figure 1:
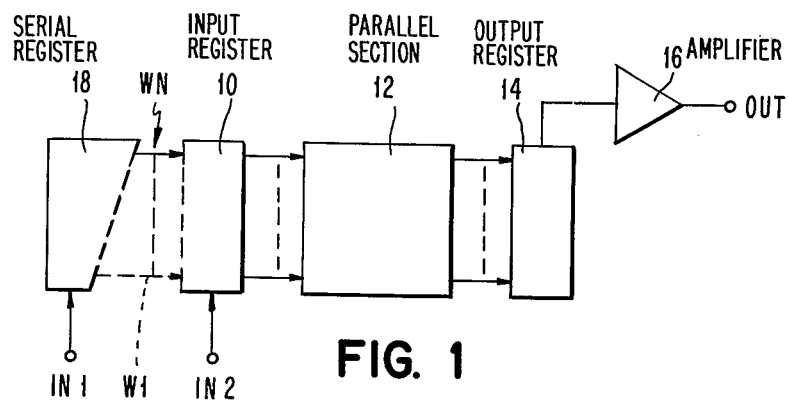
FIG. 1 is a block diagram schematically illustrating the invention.

Referring now to FIG. 1, there is shown a schematic block diagram of the test site of the present invention. It can be best understood by first considering it as a conventional SPS configuration. As previously mentioned, a conventional SPS configuration includes the serial input register 10, a parallel section 12 and a serial output register 14. An input terminal transfers data bits in series into serial register 10 until register 10 becomes filled. At this point, the contents of register 10 are transferred in parallel to parallel section 12. Semiconductor structures for achieving improvements such as interlaced SPS operation, etc., are well known and need not be described herein. As will become apparent, the present invention has applicability to all such known types of SPS configurations. The data transferred into the first column of parallel section 12 is then transferred in parallel through section 12 and into output register 14. Register 14 then serially outputs the data bits into an amplifier 16 which provides a binary output at the output terminal. Various amplifier configurations performing the function of amplifier 16 are well known. Basically, amplifier 16 detects the charge at the output of serial register 14. Such charge may not always be a full binary 1 or 0 but has distinguishable analog levels according to the input threshold capabilities conventional in amplifier 16. In conventional SPS storage systems, amplifier 16 converts these charge levels to full binary values. In a number of applications the output of amplifier 16 is recirculated to the input terminal of serial input register 10.

In accordance with the present invention, an additional serial CCD register 18 is provided. Register 18, however, is spaced at variable distances from register 10. The isolation region, also referred to as a channel stop is made very large (WI) at the input positions of register 10 and 18 and made progressively smaller. At the closest spacing (WN) between registers 10 and 18, charge transfer between the two registers is certain. Thus, if in the last position of register 18, a binary 1 were to be placed, while a binary 0 is placed in the last position of register 10, then the cross-talk would result in charge equalization preventing the determination of the data that had been stored in the last position of register 10.

In practice, the spacing of register 18 with respect to register 10 will cause charge transfer (and resultant data loss) in one or more of the intermediate positions of register 10. Also, when the configuration illustrated in FIG. 1 is a test site, parallel section 12 has only a sufficient number of stages to complete the parallel transfer from register 10 to register 14. For example, a first stage in parallel section 12 can receive the information from register 10, a second stage in parallel section 12 can act as a transfer stage while a third stage in parallel section 12 can act as the output stage to register 14. This contrasts with conventional SPS storage systems in which a parallel section 12 could typically have hundreds of stages.

Figure 2:
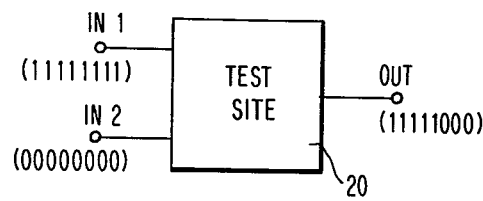
FIG. 2 is a block diagram schematically illustrating the operation of the invention.

Refer now to FIG. 2 in which test site 20 represents, in block form, the entire test site depicted in FIG. 1. For purposes of illustration, serial registers 18, 10, and 14 have each been designated as capable of storing 8 bits. To operate test site 20, a series of binary 1's are applied to input terminal 1 simultaneously with the series of binary 0's being applied to input terminal 2. Thus, register 18 receives all 1's while register 10 receives all 0's. In surface channel CCD's, binary 0's preferably include background charges (fat 0's) sufficient for quenching the majority of surface states. As the spacing between registers 18 and 10 decreases, parasitic charge transfer between the wells of the two registers increases until the charge levels in corresponding bit positions of register 18 and register 10 tend to equalize. The amount of charge leakage (equalization) is a function of time and will be a function of clock frequency which controls the duration of time during which charge leakage occurs. When all eight bit positions in register 10 have been filled, the data is transferred in parallel to register 12 and subsequently to register 14. Data is then read serially from register 14 through amplifier 16.

By the present example, the last position in registers 18 and 10 was spaced sufficiently close to cause a significant amount of charge comprising the one bit in register 18 to be leaked to register 10. This charge eventually transferred through parallel section 12 to output register 14, results in a binary 1 being read out as the first bit from amplifier 16.

By the present example, charge leakage between registers 18 and 10 also took place in the four additional bit positions before the last bit position so that five binary 1's are read from amplifier 16 before the three 0's are read. In this example, therefore, the spacing between registers 18 and 10 is adequate for the first three bit positions and inadequate for the remaining five bit positions.

Such a test site is not only advantageous during the design of the CCD memories but is intended to be incorporated on production CCD memory units. Since the test site has the identical process variations as the remainder of the semiconductor wafer or chip, significant reliability and yield data can be obtained from exercising the test site.

BEST MODE FOR CARRYING OUT THE INVENTION

Figure 3:
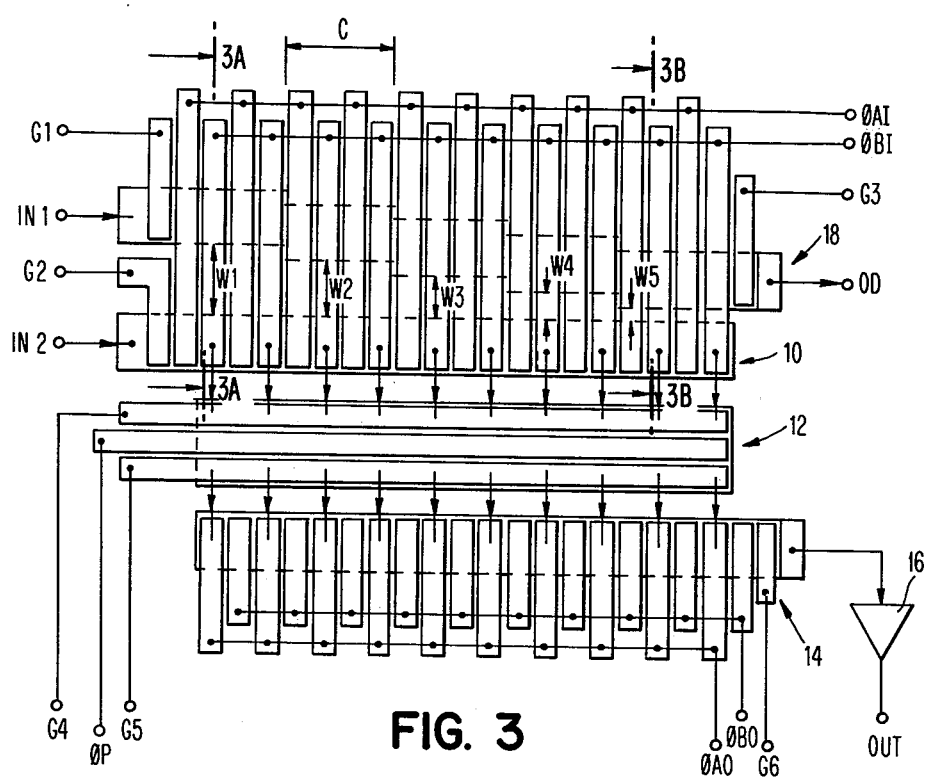
FIG. 3 is a top view illustrating the layout of the invention on a semiconductor surface.

Although a number of arrangements will provide the function desired to be performed by the test site of the invention, a preferred mode is illustrated in FIG. 3. The serial input register 10, parallel section 12, and serial output register 14 are of conventional design as is amplifier 16. Corresponding reference numerals have been utilized to designate reference numerals corresponding to those of FIG. 1. Input register 10, output register 14, and incrementally spaced serial register 18 have each been made ten bits long. Illustrated is a two phase two gate arrangement wherein the storage and transfer areas under the individual gates are arranged to propagate charge to the right. Directionality is obtained by a structural asymmetry such as an off-set gate or ion implant. A bit position consists of one adjacent φA gate and φB gate. The first φA gate (on the left) has no transfer area but acts as a metering gate. Charge transfer between register 18 and register 10 is by charge leakage equilibration wherein charge is transferred over the lowered barrier formed by the defective or insufficient channel stop. The incremental spacing of register 18 has been designed to be four storage positions long as illustrated at C. Thus, in the illustrated arrangement, at each incremental spacing a maximum of two bits can have charge transfer from register 18 to register 10. This increases the reliability of the results obtained by this invention. (Reliability is further increased by having many bit positions at each fixed separation W, with a statistical analysis of the varying amounts of transferred charge.)

The first input terminal IN 1 is connected to an input device of register 18. A second input terminal is connected to an input device of register 10. In operation, terminal G1 is pulsed to the potential for a "1" packet of signal charge to be injected into the metering well under the first φAI gate. When φAI clock goes high input IN 1 is pulsed low allowing charge to flow over the potential level of G1 into the metering well under the first φAI gate. IN 1 is then pulsed high to turn off the charge injection and provide a sink for electrons to spill back out of the first metering well over the potential barrier of the G1 gate when the metering well is over filled. φBI is pulsed high and G1 is pulsed low to form a barrier to the left for all charges. φAI is then pulsed low allowing the charge in the metering well and all storage wells under φAI electrodes to spill charge over φBI barriers into φBI storage wells.

The same action is required to store a "0" signal in register 10 except that G2 is pulsed to the potential level that allows a packet of charge representing a "0" into the metering well. This amount may be a "Fat Zero" or no charge at all. In the so called "fill and spill" technique, terminals IN 1 and IN 2 can be connected in common for simultaneous charge injection into registers 18 and 10.

The illustrated electrodes are conductors fabricated from either doped polysilicon or metal as is well known in the art. Since the same electrode extends over both register 18 and register 10, bits are maintained under identical phase electrodes. It is conventional for a thin oxide to separate the electrodes from the underlying semiconductor surface in the active areas of register 18 and register 10. In the space between register 18 and register 10, a thicker oxide separates the electrodes from the substrate surface preventing the phase clock signals from affecting charge in these "channel stop" regions of the substrate. Thus, at W1 registers 18 and 10 are separated by virtue of the fact that the electrodes are separated from the substrate by a thick oxide in the region designated by W1. In the region designated by W2, a smaller section of thick oxide underlies the second set of four electrodes and the thin oxide active region of register 18 has effectively been moved closer to register 10 by an incremental amount. At W3, W4, and W5 the distance between registers 18 and 10 has been further narrowed as shown. In order to prevent charge accumulation in the last bit position of register 18, a gating signal is applied to terminal G3 and its corresponding electrode to transfer the charge to an output device to be either sensed at terminal OD using conventional circuits—or drained away.

After register 10 is filled, a terminal G4 permits the charge packets in register 10 to be transferred to the parallel section. Thus, ten bits are transferred in parallel from serial register 10 to parallel register 12. A phase pulse $\phi P$ applied at the designated terminal brings the data bits under the second electrode in the parallel section while the gating pulse at terminal G5 provides the output gating into the output serial register 14. Output serial register 14 is the same length as registers 10 and 18 and is also two phase. The two phase output clock pulses $\phi AO$ and $\phi BO$ applied to the correspondingly designated terminals shift the date serially through the output register 14. The data is shifted out under the control of a gating pulse applied to terminal G6 from where it is gated through an output device (considered part of the sense amplifier 16) which senses the charge. By keeping track of the grouping of bits read from the output register 14, a continuous serial bit stream can be monitored under varying parameters for an extended period of time.

Figure 3A:
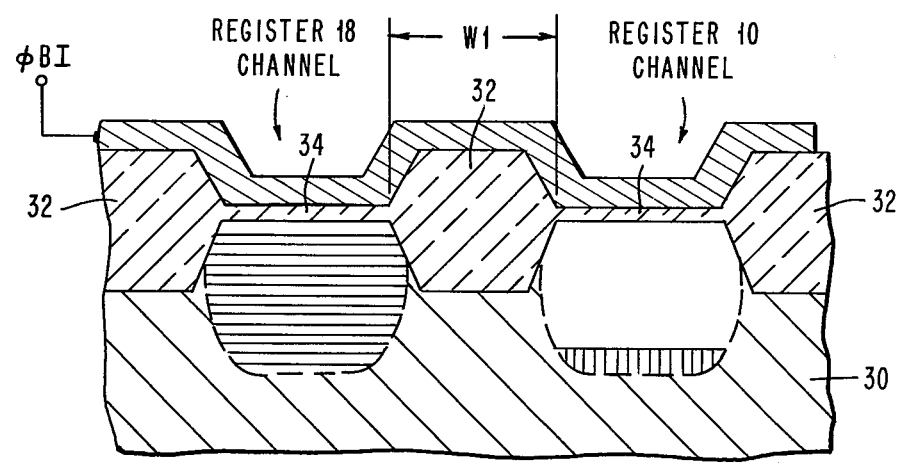
FIG. 3A is a sectional view along section lines 3A in FIG. 3.

Refer now to FIG. 3A illustrating a cross-sectional view along sectional lines 3A of FIG. 3. The semiconductor substrate 30 can be doped with impurities of either N or P type depending on whether an N channel or P channel type CCD is desired. Channels are isolated from each other by thick oxide regions 32. Thin gate oxide 34 is present over the channel regions. The gate electrode connected to terminal $\phi BI$ overlies the structure and is conventionally made from highly doped polysilicon or metal. To this point, the illustrated structure does not differ from conventional structures in which several serial CCD registers are placed in parallel. The distance W1 is sufficient to prevent leakage from the register 18 channel to the register 10 channel. A binary 1 signal charge is shown injected into the register 18 channel while a binary 0 signal charge has been injected into the register 10 channel. The small amount of charge seen in the register 10 channel is the "fat 0" charge which is conventionally injected into the surface channel CCD's and recognized as a binary 0. Our invention is equally applicable to buried channel CCD's in which there is usually no "fat 0" requirement and a binary 0 can be designated by an absence of charge in the potential well. It should be noted that in accordance with this invention, binary "1" and "0" levels need not be used. It is only necessary to have a distinguishable charge difference to perform the test analysis.

Figure 3B:
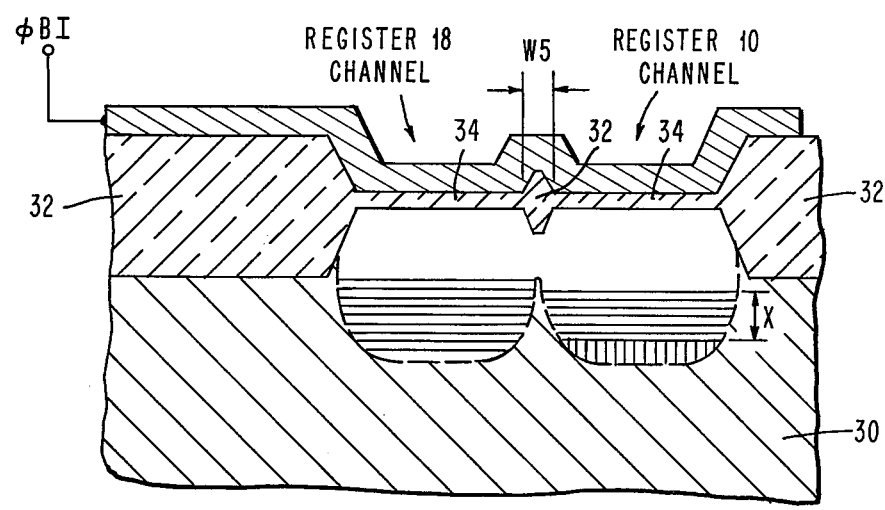
FIG. 3B is a sectional view along section lines 3B in FIG. 3.

Refer now to FIG. 3B which illustrates a cross-sectional view along section line 3B in FIG. 3. At this point, the register 18 channel and the register 10 channel have been brought significantly closer and are separated only by a distance W5. As illustrated, this permits significant leakage from the register 18 channel to the register 10 channel. The excess charge that was coupled from register 18 to register 10 is designated by dimension X. The total indicated amount of charge in register 10 (the initial fat 0 charge plus the excess charge coupled from register 18) is transferred in parallel to parallel section 12 and serially out of the register 14. The output of register 14 is then sensed by amplifier 16.

As has been pointed out hereinabove, sensing can be accomplished with a conventional amplifier utilized to sense the output of charge coupled devices. For the purposes of the present invention, sensing is preferably accomplished with a linear amplifier providing an analog output. This permits subsequent amplification with a high gain amplifier to obtain detailed statistical data as to the transfer efficiency, defect size, and other characteristics at each individual potential well. By keeping track of the charge packets, a continuous stream of packets can be analyzed over an extended period of time under a large number of variable parameters. The amplitude and frequency of the phase clocks can be varied. The signal size of the binary 1's and 0's that are inputted can also be varied. Also, the temperature as well as the substrate bias as well as other power supply potentials can be varied. In this way, a detailed technical analysis is obtained with a single test site occupying relatively little space on the semiconductor surface.

As an alternative to analog sensing, a CCD sense amplifier providing full binary level outputs can also be utilized. For the present invention, the threshold voltage of such an amplifier would be set a small predetermined amount above the "fat 0" level. Threshold levels of such amplifiers are conveniently set by varying resistance and compacitance values as well as by varying the reference potential applied as a reference voltage.

An example of sense amplifiers for amplifying the outputs of charge coupled devices is found in Kosonocky et al., "Basic Concepts of Charge-Coupled Devices", RCA Review, September 1975, Volume 36, No. 3. Particularly at pages 586-592, two output techniques are described. The first is a floating-diffusion amplifier which is the type illustrated in our drawing FIG. 3. Depending on the desired sensitivity of charge sensing, the floating-gate amplifier described in detail at page 589, etc., in the Kosonocky et al. article can be advantageously utilized as the output device/amplification scheme for the test site of our invention. It is noted that the test site we have invented is a serial parallel serial configuration wherein an additional register with variable spacing from the serial input register is provided. This test device should not be construed to be limited to a particular technology, output device, or sense amplifier.

Although specific preferred embodiments have been illustrated, it is apparent that this invention has application for buried charge coupled devices (BCCD) as well as multi-level store (MLS). In multi-level store, as described in Anantha et al. Application Ser. No. 747,658, filed on Dec. 6, 1976, now U.S. Pat. No. 4,139,910 issued on Feb. 13, 1979, for "Charge Coupled Device Memory With Method Of Doubling Storage Capacity", a number of bits can be stored at the same bit position by suitably detecting different threshold levels with an amplifier. Excess leakage could be there detected by the test site of the present invention.

While we have illustrated and described the preferred embodiment of our invention it is to be understood that we do not limit ourselves to the precise construction herein disclosed and the right is reserved to all changes and modifications coming within the scope of the invention as defined in the appended claims.

Having thus described our invention, what we claim as new and desire to secure by Letters Patent is:

1. A test site for an integrated circuit chip including a serial-parallel-serial charge coupled device electronic data storage, said test site comprising:

a first charge coupled device register having a plurality of data bit positions, and adapted to receive a first serial stream of data bits at a first one of said data bit positions, and for transferring said data bits to successive data bit positions in response to a plurality of clock signals;

a second charge coupled device register also having a plurality of data bit positions, and adapted to receive a second stream of serial data bits at a first one of its data bit positions, and for transferring its data bits to successive data bit positions in response to said same plurality of clock signals;

said first and second registers being closely spaced in parallel relationship to each other on said integrated circuit chip, a successive corresponding plurality of their data bit positions being spaced at incrementally variable intervals with respect to each other such that data bits of one binary value in a bit position of said first register may at least partially be transferred to a corresponding bit position in said second register as a function of the spacing of said corresponding bit positions with respect to each other; and means for transferring said binary valued data bits in parallel from each of the plurality of data bit positions in said second register.

2. A test site for an integrated circuit chip as in claim 1 wherein said first and second registers spaced at said incrementally variable intervals comprise:

a large spacing near the input of each said registers and a small spacing near the output of each said registers.

3. A test site for an integrated circuit chip as in claim 1 wherein said first and second registers being closely spaced in parallel relationship to each other on said integrated circuit chip, a successive corresponding plurality of their data bit positions being spaced at variable intervals with respect to each other, comprises:

at least two corresponding data bit positions being spaced at the same distance from each other.

4. A test site for an integrated circuit chip as in claims 2, 1, or 3 further comprising:

a parallel section for receiving said data in parallel from said second register;

a third register adapted to receive data in parallel from said parallel section, said third register being adapted to output said data in series to a sense amplifier.

* * * * *